United States Patent
Krounbi et al.

(10) Patent No.: US 9,236,561 B2
(45) Date of Patent: Jan. 12, 2016

(54) METHOD AND SYSTEM FOR PROVIDING MULTIPLE SELF-ALIGNED LOGIC CELLS IN A SINGLE STACK

(75) Inventors: Mohamad Towfik Krounbi, San Jose, CA (US); Dmytro Apalkov, San Jose, CA (US); Vladimir Nikitin, Campbell, CA (US); Alexander A. G. Driskill-Smith, Redwood City, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 678 days.

(21) Appl. No.: 13/604,182

(22) Filed: Sep. 5, 2012

(65) Prior Publication Data

US 2015/0200357 A1    Jul. 16, 2015

Related U.S. Application Data

(60) Provisional application No. 61/533,584, filed on Sep. 12, 2011.

(51) Int. Cl.
| | |
|---|---|
| *H01L 21/00* | (2006.01) |
| *H01L 29/82* | (2006.01) |
| *H01L 43/12* | (2006.01) |
| *H01L 43/02* | (2006.01) |
| *H01L 43/08* | (2006.01) |
| *G11C 11/56* | (2006.01) |
| *G11C 11/16* | (2006.01) |
| *H01L 27/22* | (2006.01) |

(52) U.S. Cl.
CPC ............. *H01L 43/12* (2013.01); *G11C 11/161* (2013.01); *G11C 11/5607* (2013.01); *H01L 43/02* (2013.01); *H01L 43/08* (2013.01); *H01L 27/228* (2013.01)

(58) Field of Classification Search
USPC ......................................................... 365/173
See application file for complete search history.

(56) References Cited

U.S. PATENT DOCUMENTS

| | | | |
|---|---|---|---|
| 5,783,284 A * | 7/1998 | Shinjo ................... | B82Y 10/00 257/E43.004 |
| 6,072,718 A | 6/2000 | Abraham | |
| 6,812,537 B2 | 11/2004 | Okazawa et al. | |
| 6,927,995 B2 | 8/2005 | Nickel | |

(Continued)

OTHER PUBLICATIONS

PCT International Search Report and Written Opinion of the ISA, application No. PCT/US08/64794.

(Continued)

*Primary Examiner* — Hoang-Quan Ho (74) *Attorney, Agent, or Firm* — Convergent Law Group LLP (57) ABSTRACT

A magnetic device including memory cells is provided. Each memory cell can store multiple bits corresponding to multiple data storage layers. Desired spacing(s) and desired junction angle(s) for the data storage layers are determined in each memory cell. The desired junction angle(s) and the desired spacing(s) correspond to spin transfer switching currents for the data storage layers having. A magnetoresistive stack including plurality of layers for each of the memory cells is deposited. The memory cells include the data storage layers. A data storage layer layers is spaced apart from nearest data storage layer(s) by a distance corresponding to the desired spacing(s). A mask corresponding to the memory cells is provided on the layers. The memory cells are defined such that each memory cell has the desired junction angle(s) and the desired spacing(s) and such that the data storage layers for each of the memory cells is self-aligned.

13 Claims, 5 Drawing Sheets

(56) References Cited

U.S. PATENT DOCUMENTS

| | | | |
|---|---|---|---|
| 7,173,848 B2 | 2/2007 | Ju | |
| 7,405,961 B2 * | 7/2008 | Haratani | G11C 11/16 365/158 |
| 7,460,393 B2 * | 12/2008 | Haratani | G11C 11/16 365/158 |
| 7,755,933 B2 | 7/2010 | Guo | |
| 7,764,539 B2 | 7/2010 | Guo | |
| 7,804,710 B2 | 9/2010 | Reohr | |
| 7,936,597 B2 | 5/2011 | Clinton et al. | |
| 8,098,520 B2 | 1/2012 | Seigler et al. | |
| 2003/0067800 A1 * | 4/2003 | Koganei | G11C 11/15 365/158 |
| 2004/0136231 A1 * | 7/2004 | Huai et al. | 365/158 |
| 2005/0219767 A1 * | 10/2005 | Nakamura | H01L 43/08 360/324.1 |
| 2006/0033136 A1 * | 2/2006 | Liu | B82Y 10/00 257/296 |
| 2006/0279881 A1 * | 12/2006 | Sato | G11B 5/3932 360/324.12 |
| 2007/0063237 A1 * | 3/2007 | Huai et al. | 257/295 |
| 2009/0243009 A1 | 10/2009 | Li | |
| 2010/0200900 A1 * | 8/2010 | Iwayama | B82Y 25/00 257/295 |
| 2010/0315870 A1 * | 12/2010 | Abedifard | 365/171 |
| 2011/0037108 A1 * | 2/2011 | Sugiura | H01L 27/228 257/295 |
| 2011/0090732 A1 | 4/2011 | Li | |
| 2012/0070693 A1 * | 3/2012 | Abarra | B82Y 10/00 428/811.2 |

OTHER PUBLICATIONS

PCT International Search Report and Written Opinion of the ISA, application No. PCT/US08/66369.
PCT International Search Report and Written Opinion of the ISA, application No. PCT/US10/47941.
PCT International Search Report and Written Opinion of the ISA, application No. PCT/US10/59184.
Office Action issued Apr. 2008 for U.S. Appl. No. 11/239,969.
Office Action issued Sep. 2008 for U.S. Appl. No. 11/239,969.
Office Action issued Jan. 2010 for U.S. Appl. No. 12/133,671.
Office Action issued Apr. 2009 for U.S. Appl. No. 12/133,671.
Office Action issued Mar. 2011 for U.S. Appl. No. 12/638,902.

* cited by examiner

METHOD AND SYSTEM FOR PROVIDING MULTIPLE SELF-ALIGNED LOGIC CELLS IN A SINGLE STACK

CROSS-REFERENCE TO RELATED APPLICATIONS

This application claims the benefit of provisional patent application Ser. No. 61/533,584, filed Sep. 12, 2011, assigned to the assignee of the present application, and incorporated herein by reference.

GOVERNMENT RIGHTS

This invention was made with U.S. Government support under Grant/Contract No. HR0011-09-C-0023 awarded by DARPA. The U.S. Government retains certain rights in this invention.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state. Further, multiple memory cells may be included in a single memory stack.

Figure 1:
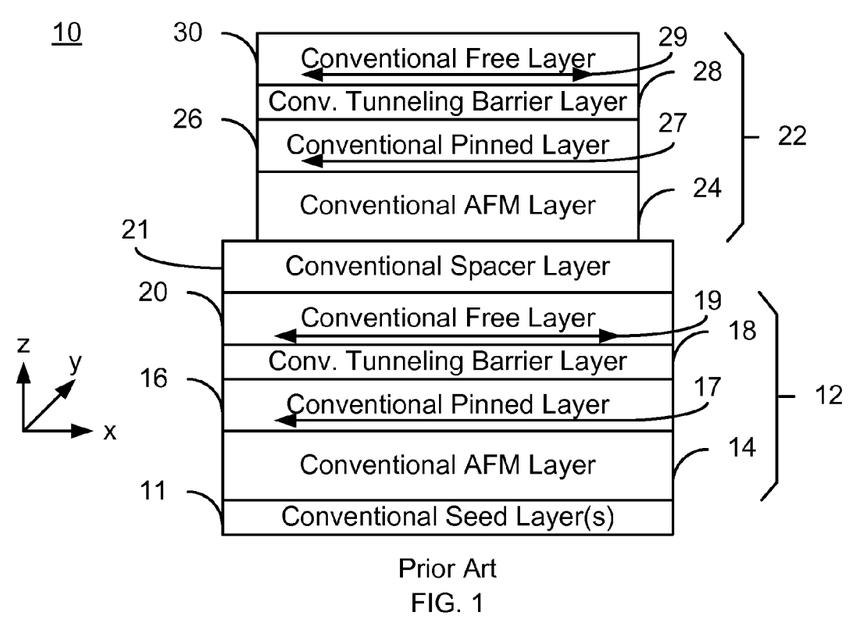
FIG. 1 depicts a conventional magnetic memory cell capable of storing multiple bits.

For example, FIG. 1 depicts a conventional multi-bit magnetic memory cell 10 as it may be used in a conventional STT-RAM. The conventional memory cell 10 stacks multiple conventional magnetic tunneling junctions (MTJs) 12 and 22. MTJ 12 includes a conventional antiferromagnetic layer 14, a conventional pinned layer 16 having magnetization 17, conventional tunneling barrier layer 18, and conventional free layer 20 having changeable magnetization 19. The MTJ 22 includes a conventional antiferromagnetic layer 24, a conventional pinned layer 26 having magnetization 27, conventional tunneling barrier layer 28, and conventional free layer 30 having changeable magnetization 29. The free layers 20 and 30 are the data storage layers. Stated differently, the free layers 20 and 30 have changeable magnetizations 19 and 29 the orientation of which determines the state of the memory MTJ 12 and 22, respectively. Each MTJ 12 and 22 is separated by a nonmagnetic, metallic spacer 21. Each MTJ 12 and 22 may also be considered to correspond to a separate magnetic memory cell. Also shown is conventional seed layer 11. The conventional memory stack might also include contacts (not shown) as well as a selection device (not shown), such as a transistor. In operation, the conventional MTJs/memory cells 12 and 22 are switched using different switching currents. Each conventional MTJ/memory cell 12 and 22 also has two stable states. Thus, the combination of the MTJs/memory cells 12 and 22 in the memory stack 10 may store two bits (e.g. logical states 00, 01, 10, and 11).

The conventional memory stack 10 is typically formed by depositing all of the layers 14, 16, 18, 20, 21, 24, 26, 28, and 30. A portion of the layers 14, 16, 18, 20, 21, 24, 26, 28, and 30 is covered by a mask and the MTJ 12 or 22 is defined. The mask is removed and another mask corresponding to the other MTJ 22 or 12 and the other MTJ 22 or 12 defined. For example, a mask covering a smaller area may be provided and the MTJ/memory cell 22 defined. A larger mask may then be provided and the MTJ/memory cell 12 defined.

Although the conventional memory stack 10 and MTJs 12 and 22 function, other methods for forming a multiple bit memory cell 22 are desired.

SUMMARY

A method and system for providing a magnetic device including a plurality of memory cells is described. Each of the memory cells is capable of storing a plurality of bits corresponding to a plurality of data storage layers. At least one desired spacing and at least one desired junction angle are determined for the data storage layers in each of the memory cells. The desired junction angle(s) and the desired spacing(s) correspond to the data storage layers having a plurality of spin transfer switching currents. A magnetoresistive stack including layers for each of the memory cells is deposited. The memory cells include the plurality of data storage layers. A data storage layer of plurality of data storage layers is spaced apart from a nearest data storage layer of plurality of data storage layers by a distance corresponding to the desired spacing(s). A mask corresponding to the memory cells is provided on the layers. The memory cells are defined such that each of the memory cells has the desired junction angle(s) and the desired spacing(s) and such that the data storage layers for each memory cell is self-aligned.

DETAILED DESCRIPTION OF THE INVENTION

The exemplary embodiments relate to magnetic junctions usable in magnetic devices, such as magnetic memories, the devices using such magnetic junctions, and methods for fabricating such magnetic devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. The exemplary embodiments provide methods and systems for providing a magnetic junction usable in a magnetic device. A method and system for providing a magnetic device including a plurality of memory cells is described. Each memory cell is capable of storing multiple bits corresponding to multiple data storage layers. Desired spacing(s) and desired junction angle(s) are determined for the data storage layers in each of the memory cells. The desired junction angle(s) and the desired spacing(s) correspond to the data storage layers having a plurality of spin transfer switching currents. A magnetoresistive stack including layers for each of the memory cells is deposited. The memory cells include the plurality of data storage layers. A data storage layer of plurality of data storage layers is spaced apart from a nearest data storage layer of plurality of data storage layers by a distance corresponding to the desired spacing(s). A mask corresponding to the memory cells is provided on the layers. The memory cells are defined such that each of the memory cells has the desired junction angle(s) and the desired spacing(s) and such that the data storage layers for each memory cell is self-aligned. In at least some embodiments, each memory cell includes at least one magnetic junction. The magnetic junction includes a pinned layer, a plurality of nonmagnetic spacer layers, and a plurality of free layers. The plurality of free layers is interleaved with the plurality of nonmagnetic spacer layers. A first nonmagnetic spacer layer of the plurality of nonmagnetic spacer layers is between the plurality of free layers and the pinned layer. Each of the plurality of free layers is configured to be switchable between a plurality of stable magnetic states when a write current is passed through the magnetic memory cell. Each of the plurality of free layers has a critical switching current density. The critical switching current density of one of the plurality of free layers changes monotonically from the critical switching current density of an adjacent free layer of the plurality of free layers. The adjacent free layer is between the pinned layer and the one of the plurality of free layers.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
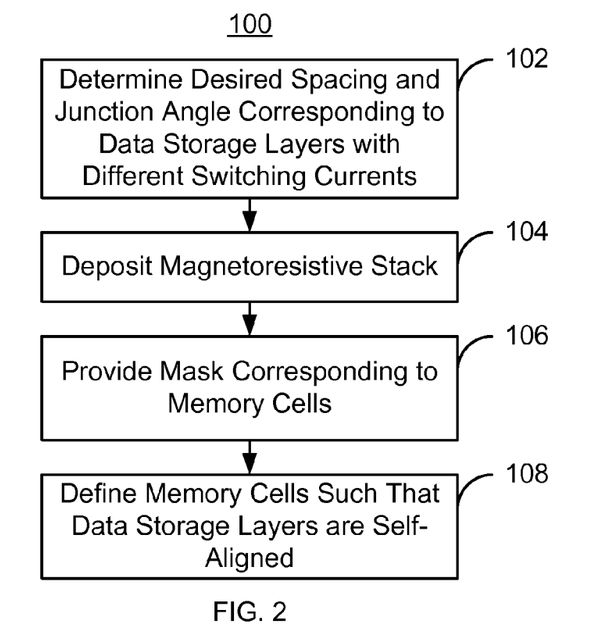
FIG. 2 depicts an exemplary embodiment of a method for fabricating a self-aligned memory cell capable of storing multiple bits that are separately programmable.

FIG. 2 depicts an exemplary embodiment of a method 100 for fabricating a magnetic memory cell capable of storing multiple bits. For simplicity, some steps may be omitted, combined, and/or interleaved. Further, in some embodiments, the steps may be performed in another order. The memory cell being fabricated is switchable using a current driven through the memory cell. Thus, the memory cell employs spin transfer switching of the data storage layers in the memory cell. In some embodiments, the memory cell stores one bit for each data storage layer in the memory cell stack. For example, if two data storage layers are provided, then two bits are stored in the magnetic memory cell. Further, each data storage layer is desired to be separately programmable. Thus, each data storage layer may have a different switching current. Stated differently, each data storage layer switches at a different current. In some embodiments, the switching current for adjacent data storage layers differs by at least ten percent. Thus, inadvertent switching of data storage layers may be reduced or eliminated.

The desired spacing(s) and junction angle(s) for the memory cell are determined, via step 102. The desired spacing(s) and junction angle(s) correspond to data storage layers (such as free layers) having different geometries. In some embodiments, the junction angle(s) are desired to be at least sixty and not more than ninety degrees. In some such embodiments, the junction angle(s) are desired to be not more than eighty-five degrees. The combination of the separation between data storage layers and the junction angles result in data storage layers having different sizes. These differences in geometry (as well as other differences such as magnetic moment or other anisotropies) may result in the data storage layers having different switching currents for spin transfer-based switching. For example, in some embodiments, the size (e.g. width and/or length) of the data storage layer may differ by at least ten percent. This may correspond to a switching current difference of ten percent or more. In other embodiments, the difference in size of adjacent data storage layers is desired to be up to thirty percent. In other embodiments, the sizes of adjacent data storage layers are desired to be thirty through fifty percent different (or more). In some embodiments, the data storage layers have the same footprint or shape as viewed in the plan view. However, as discussed above the sizes of the data storage layers differ, resulting in different switching currents. In such embodiments, therefore, it is only a difference in size that results in the different switching currents. In other embodiments, the footprints of the data storage layers in the memory cell may differ. Stated differently, the data storage layers have different shapes as seen in the plan view. In such embodiments, therefore, the difference in switching current may be attributable to both size and shape, A magnetoresistive stack including layers for the memory cells is deposited, via step 104. In some embodiments, step 104 includes depositing layers for multiple magnetoresistive junctions. Each magnetoresistive junction includes at least a pinned layer, a nonmagnetic spacer layer such as Cu or MgO, and a free layer that serves as the data storage layer. A pinning layer such as an AFM layer that adjoins the pinned layer may also be provided. The pinned layer is magnetic, may be a single layer or may be a synthetic antiferromagnet, and/or may be another multilayer. The free layer/data storage layer may be a single layer or a multilayer. The layers for one magnetoresistive junction are separated by the layers for another magnetoresistive junction by a nonmagnetic, conductive spacer layer. In some embodiments, the spacer layers are nonmagnetic and conductive. In such embodiments, the spacer layers may not significantly contribute to the resistance of memory cell. In other embodiments, a single pinned layer and multiple free layers/data storage layers interleaved with the spacer layers may be deposited in step 104. The thickness(es) of the spacer layer(s) between the magnetic junctions/data storage layers correspond to the desired spacing.

A mask is provided on the magnetoresistive stack, via step 106. The mask may be a hard mask suitable for ion milling, reactive ion etching and/or another removal process. A single mask having portions covering parts of the magnetoresistive stack may be used. Portions of the mask cover regions corresponding to the tops of the memory cells. In some embodiments, step 106 includes depositing hard mask layer(s) on the magnetoresistive stack and photolithographically patterning the hard mask layer(s) to form a hard mask. However, other methods for forming the mask may be used.

The memory cells are defined from the magnetoresistive stack, via step 108. In some embodiments, step 108 includes ion milling or reactive ion etching the magnetoresistive stack such that each of memory cells has the desired junction angle(s) and the desired spacing(s). Therefore, a portion of the magnetoresistive stack is removed to provide the desired geometry of the data storage and other layers. Stated differently, the pressure, gasses, gas flow, power, substrate bias, and other parameters of the etch are configured such that step 108 removes the desired portion of the magnetoresistive stack. The memory cell(s) left have the desired junction angle(s) and desired spacing. Further, as the same mask has been used for all of the data storage layers in each memory cell, the memory cells are self-aligned.

Figure 3:
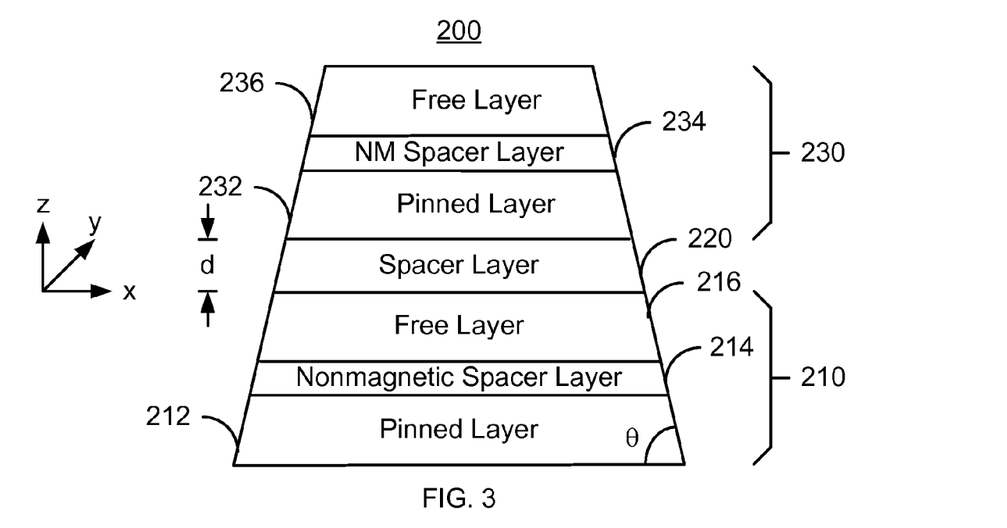
FIG. 3 depicts an exemplary embodiment of a self-aligned magnetic memory cell capable of storing multiple bits.

FIG. 3 depicts one embodiment of a magnetic memory cell 200 that may be used in an STT-RAM magnetic memory or other magnetic device and which is formed using the method 100. For clarity, FIG. 3 is not to scale. The magnetic memory cell 200 includes two magnetic junctions 210 and 230. The magnetic junction 210 includes a pinned layer 212, a nonmagnetic spacer layer 214 and a free layer 216. The magnetic junction 230 includes pinned layer 232, nonmagnetic spacer layer 234, and free layer 236. The free layers 216 and 236 are the data storage layers for the magnetic junctions 210 and 230. In some embodiments, the nonmagnetic spacer layers 214 and 234 are tunneling barrier layers, such as crystalline MgO. However, in other embodiments, the nonmagnetic spacer layers 214 and 234 may include different material(s), be conductive, and/or have another structure. In some embodiments, the magnetic moments of the pinned layers 212 and 232 and/or the free layers 216 and 236 are in plane (e.g. in the x-y plane in which the layers lie). In other embodiments, at least a component of the magnetic moments of the pinned layers 212 and 232 and/or the free layers 216 and 236 are perpendicular to plane.

The magnetic junctions 210 and 230 are separated by a spacer layer 220 having a thickness, d. In some embodiments, the spacer layer 220 is at least ten and not more than twenty nanometer thick. Although two magnetic junctions 210 and 230 are shown, another number may be fabricated. In such embodiments, the magnetic junctions are still interleaved with spacer layer(s) analogous to the spacer layer 220. Also shown is the junction angle, θ, for the memory cell 200.

Referring to FIGS. 2-3, the spacer layer 220 and the junction angle θ are configured using step 102 of the method 100. More specifically, the thickness, d, of the spacer layer 220 is selected in combination with the junction angle, θ, in step 102 to provide the desired difference in switching characteristics of the free layers 216 and 236. For example, the thickness of the spacer layer 220 may be selected to provide the desired separation in the z-direction between the free layers 216 and 236 such that the length in the x direction and/or width in the y direction of the layers 216 and 236 differ. This difference is sufficient to provide switching currents that differ to a desired extent. Thus, the free layer 216 may be switched at a different switching current than the free layer 236.

Also using the method 100, the layers 212, 214, 216, 220, 232, 234, and 236 may be blanket deposited in step 104. The spacer layer 220 has the thickness, d, determined to provide the desired spacing between the free layers 216 and 236 determined in step 102. A hard mask (not shown in FIG. 3) may be provided on the free layer 236 in step 106 of the method 100. In some embodiments, the hard mask would have the same footprint as the desired footprint of the free layer 236. The memory cell 200 would also be defined in step 108. In some embodiments, step 108 may include calibrating the pressure, removal rate, bias, and other characteristics of the removal process of step 108 with respect to the junction angle, θ. The removal process of step 108 may then be carried out to obtain the desired junction angle. In some embodiments, the junction angle is at least sixty and not more than eighty-five degrees. Because of the appropriate thickness (d)

of the spacer layer 220 deposited in step 104 and the junction angle formed in the removal process of step 108, the free layers 216 and 236 have geometries that differ in the desired manner. As a result, the switching currents of the free layers 216 and 236 also differ to a desired extent.

The memory cell 200 thus includes two data storage layers/free layers 216 and 236 corresponding to two magnetic junctions 210 and 230, respectively, in the same memory cell/stack 200. Because the method 100 has been used to fabricate the memory cell 200, the switching currents of the free layers 216 and 236 differ. For example, the switching currents may differ by at least ten percent. In other embodiments, the switching currents differ by at least twenty percent. In still other embodiments, the switching current may differ by at least thirty and not more than fifty percent. Note that in addition to the geometry, other properties of the free layers 216 and 236 and/or the magnetic junctions 210 and 230 may be tailored to achieve the desired difference in switching currents. Thus, the free layers 216 and 236 may be independently switched. The memory cell 200 may thus store multiple bits. Further, because the method 100 has been used, the free layers 216 and 236 and the magnetic junctions 210 and 230 are self-aligned. Although they differ in size, the free layers 216 and 236 may be defined using the same mask. As a result, misalignments between the free layers 216 and 236 and the magnetic junctions 210 and 230 may be reduced or eliminated. As a result, performance and reliability of the memory cell 200 may be improved.

Figure 4:
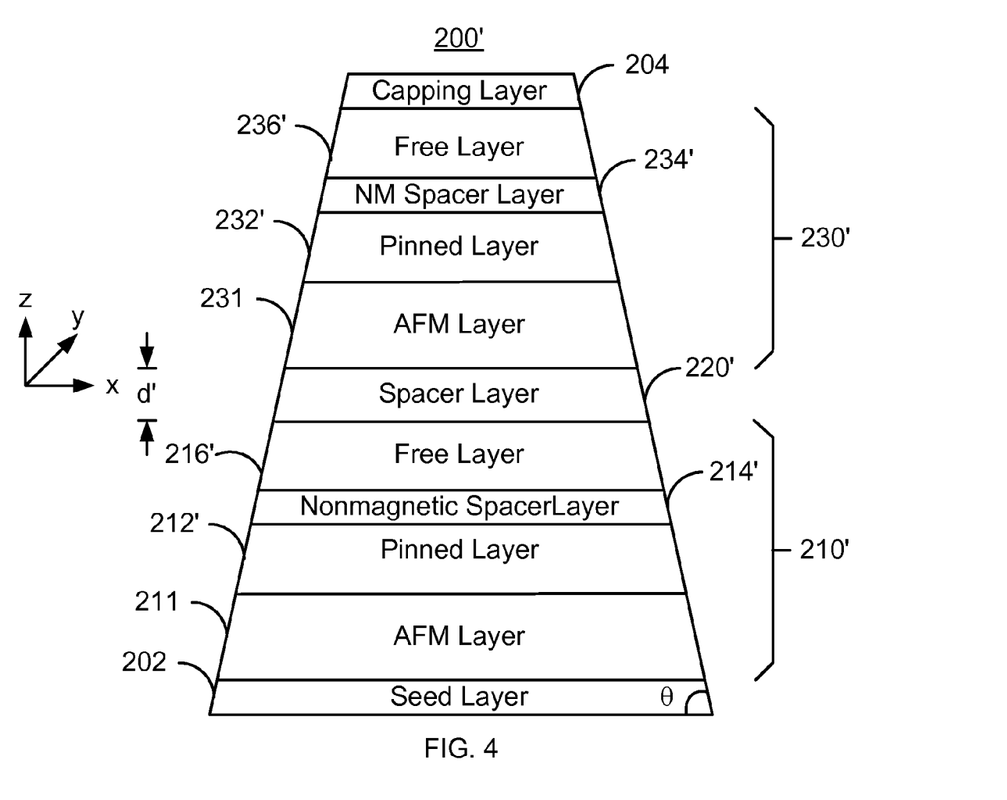
FIG. 4 depicts another exemplary embodiment of a self-aligned magnetic memory cell capable of storing multiple bits.

FIG. 4 depicts another embodiment of a memory cell 200' capable of storing multiple bits and formed using the method 100. For clarity, FIG. 4 is not to scale. The memory cell 200' is analogous to the memory cell 200 and thus includes analogous components. For example, the memory cell 200' includes magnetic junctions 210' and 230' and spacer layer 220' analogous to the magnetic junctions 210 and 230 and the spacer layer 220, respectively. The spacer layer 220' has a thickness d' analogous to the thickness d of the spacer layer 220. The magnetic junction 210' includes a pinned layer 212', a nonmagnetic spacer layer 214', and a free layer/data storage layer 216' analogous to the pinned layer 212, the nonmagnetic spacer layer 214, and the free layer/data storage layer 216, respectively. Similarly, the magnetic junction 230' includes a pinned layer 232', a nonmagnetic spacer layer 234', and a free layer/data storage layer 236' analogous to the pinned layer 232, the nonmagnetic spacer layer 234, and the free layer/data storage layer 236, respectively.

Also shown in the memory cell 200' are seed layer 202, capping layer 204 and AFM layers 211 and 231 of magnetic junctions 210' and 230', respectively. Thus, the layers 202, 204, 211, and 231 are deposited as part of the stack deposition in step 104 of the method 100. Thus, the thickness of the layer 231 may be accounted for in determining the desired thickness, d', of the spacer layer 220' and the desired spacing between the free layers 216' and 236'.

Using the method 100, the magnetic memory cell 200' may be formed. Thus, a single mask having a footprint corresponding to the footprint of the free layer 236' may be used in defining the memory cell 200'. The memory cell 200' may thus share the benefits of the memory cell 200. For example, the memory cell 200' may store multiple bits, may be self-aligned, and may have improved performance and/or reliability.

Figure 5:
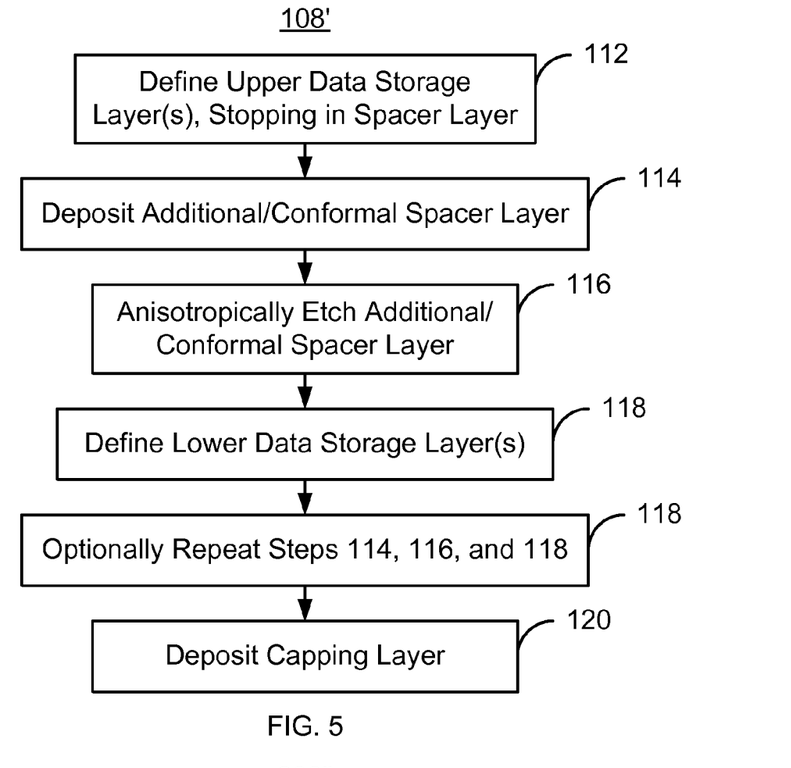
FIG. 5 depicts another exemplary embodiment of a method for fabricating a self-aligned magnetic memory cell capable of storing multiple bits.

FIG. 5 is a flow chart depicting a method 108' for defining a memory cell. The method 108' may be used in step 108 of the method 100. For clarity, some steps may be omitted, combined, and/or interleaved. Further, in some embodiments, the steps may be performed in another order. The method 108' may thus commence after the desired spacing between data storage/free layers and junction angle(s) have been selected in step 102. Further, the method 108' may also start after the layers for the memory cell have been deposited in step 104 and the mask, such as a hard mask, provided in step 106.

The upper data storage layer(s) are defined, via step 112. Thus, a portion of the top layers of the magnetoresistive stack deposited in step 104 are removed. The removal process of step 112 is configured to achieve a first junction angle. The removal process is, however, terminated after the top data storage layer is defined, but before the spacer layer has been completely defined. An additional spacer layer is then deposited, via step 114. In some embodiments, this spacer layer is conformal. Thus, the spacer layer resides on the top surface of at last part of the spacer layer and on the sides of at least the top data storage layer. In some embodiments, the spacer layer is thin. For example, the additional spacer layer may be at least ten nanometers and not more than twenty nanometers thick. The additional spacer layer is also insulating. For example, silicon oxide, silicon nitride, aluminum oxide, and/or other insulators might be used. In other embodiments, metal(s) might be used for at least part of the additional spacer layer.

The additional spacer layer is anisotropically removed, via step 116. In some embodiments, the anisotropic removal process is a reactive ion etch approach. However, other removal processes might be used. The anisotropic removal process removes the spacer layer vertically (perpendicular to the plane of the layers). Thus, at least part of the additional spacer layer on the sidewalls of the top portion of the memory cell remains. The bottom portion of the magnetoresistive stack is, however, exposed.

The lower data storage layer(s) are defined, via step 118. The removal process in step 118 is analogous to that in step 112. However, the removal process may be configured such that a different junction angle is formed for the next lower data storage layer. The next lower data storage layer in the memory cell is thus defined. Further, because of the presence of the additional spacer layer, the upper portion of the magnetic memory cell is not removed. Steps 114-118 may then be optionally repeated. Each time steps 114-118 are repeated, a new junction angle may be achieved as the parameters of the removal process are changed.

Figure 6:
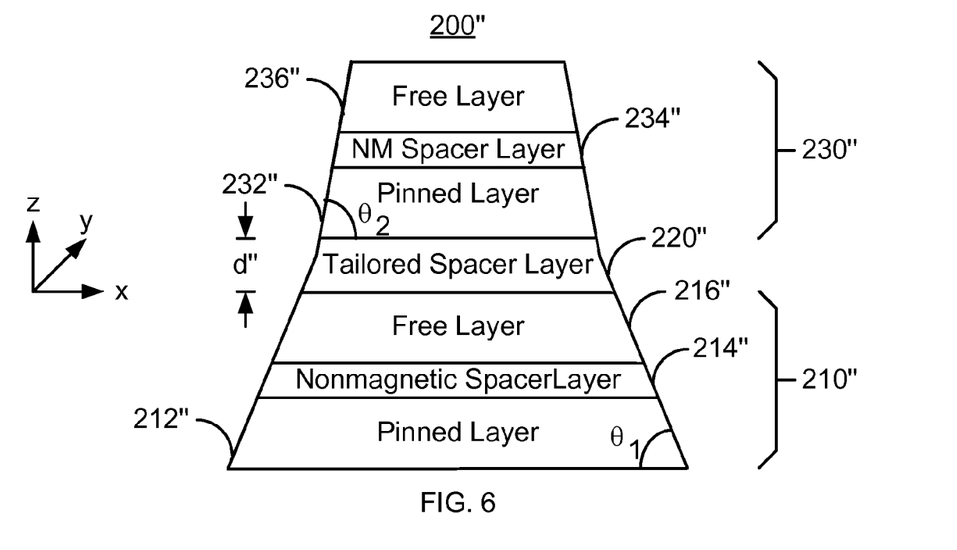
FIG. 6 depicts another exemplary embodiment of a self-aligned magnetic memory cell capable of storing multiple bits.

FIG. 6 depicts another embodiment of a memory cell 200" capable of storing multiple bits and formed using the methods 100 and 108'. For clarity, FIG. 6 is not to scale. The memory cell 200" is analogous to the memory cell 200 and thus includes analogous components. For example, the memory cell 200" includes magnetic junctions 210" and 230" and spacer layer 220" analogous to the magnetic junctions 210 and 230 and the spacer layer 220, respectively. The spacer layer 220" has a thickness d" analogous to the thickness d of the spacer layer 220. The magnetic junction 210" includes a pinned layer 212", a nonmagnetic spacer layer 214", and a free layer/data storage layer 216" analogous to the pinned layer 212, the nonmagnetic spacer layer 214, and the free layer/data storage layer 216, respectively. Similarly, the magnetic junction 230" includes a pinned layer 232", a nonmagnetic spacer layer 234", and a free layer/data storage layer 236" analogous to the pinned layer 232, the nonmagnetic spacer layer 234, and the free layer/data storage layer 236, respectively.

In addition, the memory cell 200" has junction angles $\theta_1$ and $\theta_2$. The junction angle $\theta_1$ corresponds to the removal process of step 112, while the junction angle $\theta_2$ corresponds to the removal process of step 118. The removal process of step 112 is stepped within the spacer layer 220".

Using the methods 100 and 108', the magnetic memory cell 200" may be formed. Thus, a single mask having a footprint corresponding to the footprint of the free layer 236" may be used in defining the memory cell 200". Further, due to the use of the additional spacer layer, the upper magnetic junction 220" may not be removed during the step of defining the lower magnetic junction 210". The memory cell 200" may thus share the benefits of the memory cells 200 and 200'. For example, the memory cell 200" may store multiple bits, may have different switching currents for the layers 216" and 236" due to the spacer layer 220" and junction angles $\theta_1$ and $\theta_2$, may be self-aligned, and may have improved performance and/or reliability.

Figure 7:
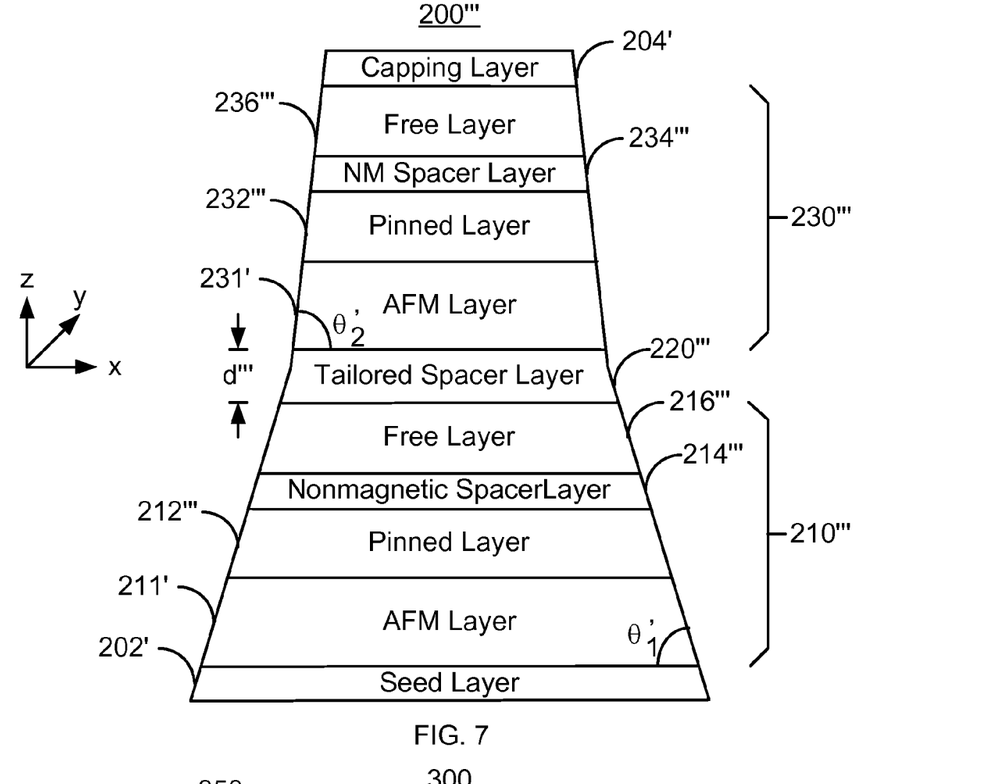
FIG. 7 depicts exemplary embodiment of a self-aligned magnetic memory cell capable of storing multiple bits.

FIG. 7 depicts another embodiment of a memory cell 200''' capable of storing multiple bits and formed using the methods 100 and 108'. For clarity, FIG. 7 is not to scale. The memory cell 200''' is analogous to the memory cells 200, 200', and 200". The memory cell 200''' thus includes analogous components. For example, the memory cell 200''' includes magnetic junctions 210''' and 230''' and spacer layer 220''' analogous to the magnetic junctions 210/210'/210" and 230/230'/230" and the spacer layer 220/220'/220", respectively. The magnetic junction 210''' includes a pinned layer 212''', a nonmagnetic spacer layer 214''', and a free layer/data storage layer 216''' analogous to the pinned layer 212/212'/212", the nonmagnetic spacer layer 214/214'/214", and the free layer/data storage layer 216/216'/216", respectively. Similarly, the magnetic junction 230''' includes a pinned layer 232''', a nonmagnetic spacer layer 234''' and a free layer/data storage layer 236''' analogous to the pinned layer 232/2327232", the nonmagnetic spacer layer 234/2347234", and the free layer/data storage layer 236/2367236", respectively. The memory cell 200''' has junction angles $\theta_1'$ and $\theta_2'$ analogous to the junction angles $\theta_1$ and $\theta_2$, respectively. The junction angle $\theta_1'$ corresponds to the removal process of step 112, while the junction angle $\theta_2$ corresponds to the removal process of step 118. The removal process of step 112 is stepped within the spacer layer 220".

Also shown in the memory cell 200''' are seed layer 202', capping layer 204' and AFM layers 211' and 231' analogous to the seed layer 202, capping layer 204, and AFM layers 211 and 231 of the magnetic memory cell 200'. Thus, the layers 202', 204', 211', and 231' are deposited as part of the stack deposition in step 104 of the method 100. Thus, the thickness of the layer 231' may be accounted for in determining the desired thickness, d''', of the spacer layer 220''' and the desired spacing between the free layers 216" and 236".

Using the methods 100 and 108', the magnetic memory cell 200''' may be formed. The memory cell 200''' may thus share the benefits of the memory cells 200, 200', and 200". For example, the memory cell 200''' may store multiple bits, may have different switching currents for the layers 216''' and 236''' due to the spacer layer 220''' and junction angles $\theta_1'$ and $\theta_2'$, may be self-aligned, and may have improved performance and/or reliability.

Figure 8:
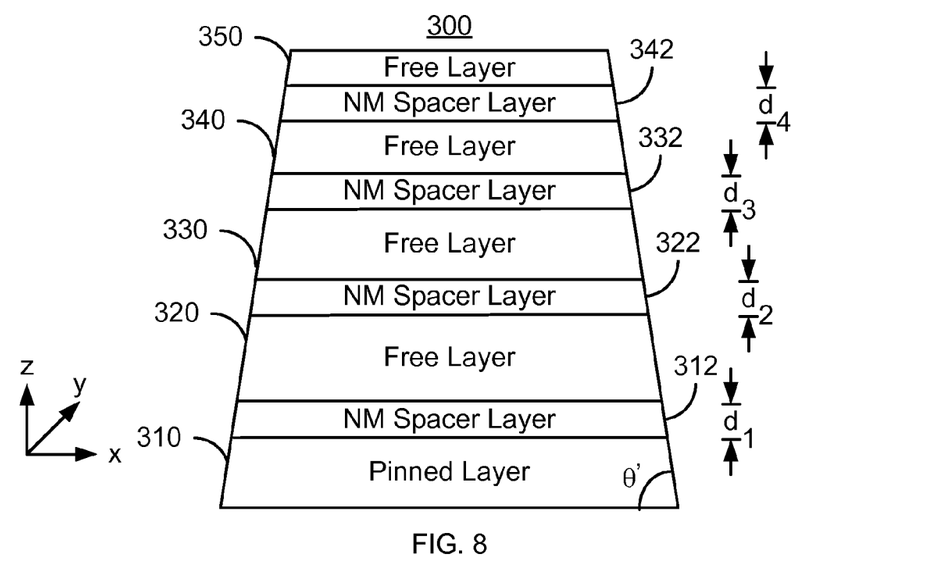
FIG. 8 depicts another exemplary embodiment of a self-aligned magnetic memory cell capable of storing multiple bits.

FIG. 8 depicts another embodiment of a memory cell 300 capable of storing multiple bits and formed using the method 100. For clarity, FIG. 8 is not to scale. The memory cell 300 is analogous to the memory cells 200, 200', 200", and 200''' in that multiple data storage/free layers 320, 330, 340, and 350 are shown. However, a single pinned layer 310 is shared by the free layers/data storage layers 320, 330, 340, and 350. The free layers 320, 330, 340, and 350 are separated by spacer layers 312, 322, 332, and 342 having thicknesses $d_1$, $d_2$, $d_3$, and $d_4$, respectively. The thicknesses of the spacer layers 312, 322, 332, and 342 may be selected in step 102 of the method 100. Further, the memory cell 300 has a junction angle, $\theta'$, selected in step 102 and formed in step 108. The free layers 320, 330, 340, and 350 have different sizes due to the junction angle and the selected thicknesses of the spacer layers 312, 322, 332, and 342. The free layers 320, 330, 340, and 350 thus have different switching current due, at least in part, to their differences in size. However, instead of each free layer 320, 330, 340, and 350 corresponding to a different pinned layer, the free layers 320, 330, 340, and 350 share the pinned layer 310. In some embodiments, a pinning layer such as an AFM layer (not shown) may also be used to pin the magnetization of the pinned layer 310. Further, other layers (not shown) such as seed, capping, and the additional spacer layer(s) (all not shown) may also be present.

Using the method 100, the magnetic memory cell 300 may be formed. The memory cell 300 may thus share the benefits of the memory cells 200, 200', and 200". For example, the memory cell 300 may store multiple bits due to the presence of the free layers 310, 320, 330, 340, and 350. Thus, the memory cell 300 may store five bits. In other embodiments, another number of free layers might be used. Because a single mask is used in defining the free layers 210, 320, 330, 340, and 350, the layers 310, 320, 330, 340, and 350 are self-aligned. The free layers 310, 320, 330, 340, and 350 may have different switching currents due at least in part to the spacer layers 312, 322, 332, and 342 and junction angle $\theta$, may be self-aligned, and may thus have improved performance and/or reliability.

Figure 9:
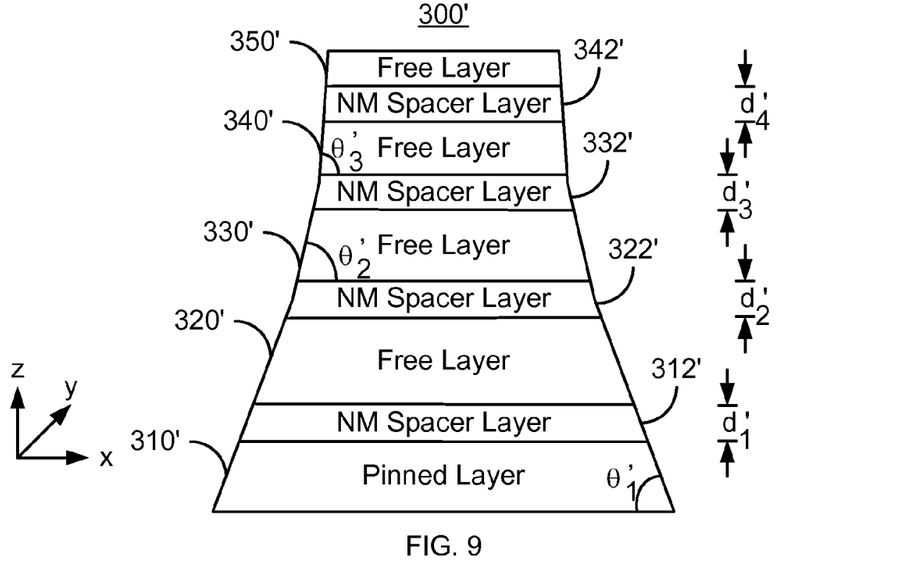
FIG. 9 depicts another exemplary embodiment of a self-aligned magnetic memory cell capable of storing multiple bits.

FIG. 9 depicts another embodiment of a memory cell 300' capable of storing multiple bits and formed using the methods 100 and 108'. For clarity, FIG. 9 is not to scale. The memory cell 300' is analogous to the memory cell 300 in that multiple data storage/free layers 320', 330', 340', and 350' are shown. The single pinned layer 310' is analogous to the pinned layer 310 and is shared by the free layers/data storage layers 320', 330', 340', and 350'. The free layers 320', 330', 340', and 350' are separated by spacer layers 312', 322', 332', and 342' having thicknesses $d_1'$, $d_2'$, $d_3'$, and $d_4'$, respectively. The thicknesses of the spacer layers 312', 322', 332', and 342' may be selected in step 102 of the method 100. Further, the memory cell 300' has junctions angle, $\theta_1'$, $\theta_2'$, and $\theta_3'$ selected in step 102 and formed using the method 108'. More specifically, steps 114, 116, and 118 may be carried out three times in order to obtain the junction angles $\theta_1'$, $\theta_2'$, and $\theta_3'$. The free layers 320', 330', 340', and 350' have different sizes due to the junction angles and the selected thicknesses of the spacer layers 312', 322', 332', and 342'. The free layers 320', 330', 340', and 350' thus have different switching current due, at least in part, to their differences in size. In some embodiments, a pinning layer such as an AFM layer (not shown) may also be used to pin the magnetization of the pinned layer 310'. Further, other layers (not shown) such as seed, capping, and the additional spacer layer(s) (all not shown) may also be present.

Using the method 100 and 108', the magnetic memory cell 300' may be formed. The memory cell 300' may thus share the benefits of the memory cells 200, 200', 200", 200''' and 300. For example, the memory cell 300' may store multiple bits, may have different switching currents for the layers 320, 330, 340, and 350 due to the spacer layers 312', 322', 332', and 342' and junction angles $\theta_1'$, $\theta_2'$, and $\theta_3'$ may be self-aligned, and may have improved performance and/or reliability.

Figure 10:
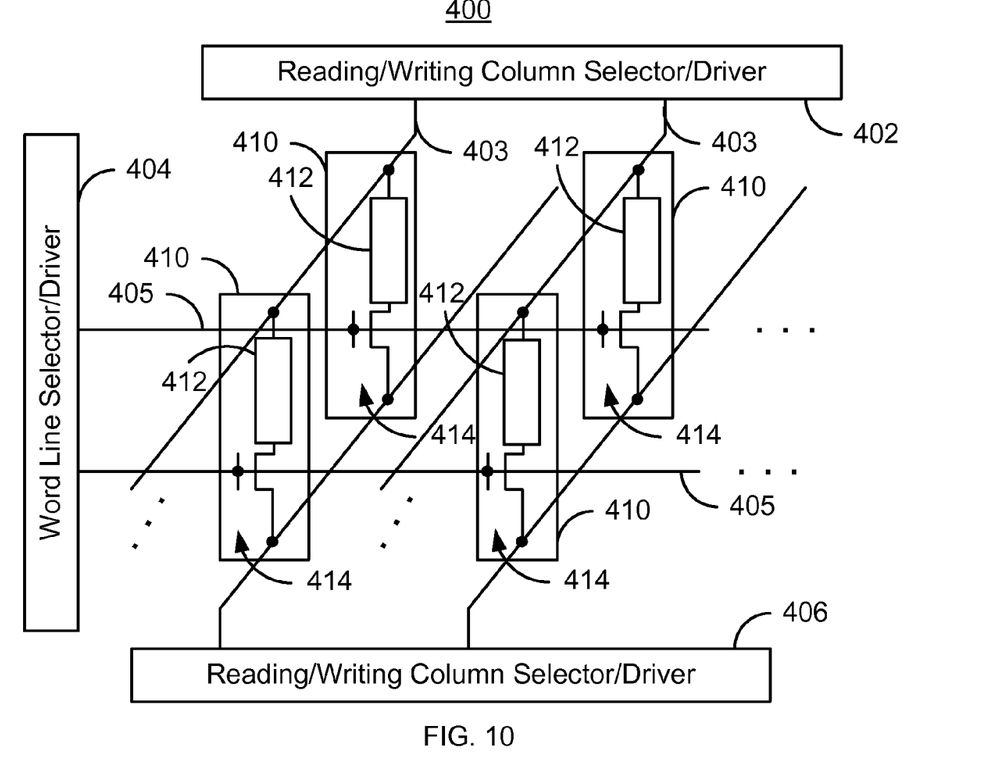
FIG. 10 depicts an exemplary embodiment of a memory utilizing magnetic junctions in the memory element(s) of the storage cell(s).

The magnetic memory cells 200, 200', 200", 200''', 300', and 300' formed using the methods 100 and/or 108' may be used in a magnetic memory. FIG. 10 depicts an exemplary embodiment of one such memory 400. The magnetic memory 400 includes reading/writing column select drivers 402 and 406 as well as word line select driver 404. Note that other and/or different components may be provided. The storage region of the memory 400 includes multi-bit cells 410. Each multi-bit cell includes at least one magnetic storage cell 412 and at least one selection device 414. In some embodiments, the selection device 414 is a transistor. The magnetic junctions 412 may be one of the magnetic storage cells 200, 200', 200'', 200''', 300, and/or 300'. Although one magnetic storage cell 412 is shown per cell 410, in other embodiments, another number of magnetic storage cell 412 may be provided per cell. As such, the magnetic memory 400 may enjoy the benefits described above, such as higher density.

Various magnetic storage cells 200, 200', 200'', 200''', 300, and 300' formed using the methods 100/108' have been disclosed. Note that various features of the magnetic storage cells 200, 200', 200'', 200''', 300, and 300' may be combined. Thus, one or more of the benefits of the magnetic storage cells 200, 200', 200'', 200''', 300, and 300' such as higher density and self-aligned properties may be achieved.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a magnetic device including a plurality of memory cells, each of the plurality of memory cells capable of storing a plurality of bits, the plurality of bits corresponding to a plurality of data storage layers, the method comprising:
    determining at least one desired spacing and at least one desired junction angle for the plurality of data storage layers in each of the plurality of memory cells, the at least one desired junction angle and the at least one desired spacing corresponding to the plurality data storage layers having a plurality of spin transfer switching currents;
    depositing a magnetoresistive stack including plurality of layers for each of the plurality of memory cells, the plurality of memory cells including the plurality of data storage layers, a data storage layer of plurality of data storage layers being spaced apart from a nearest data storage layer of plurality of data storage layers by a distance corresponding to the at least one desired spacing;
    providing a mask on the plurality of layers, the mask corresponding to the plurality of memory cells; and
    defining the plurality of memory cells such that each of the plurality of memory cells has the at least one desired junction angle and the at least one desired spacing and such that the plurality of data storage layers for each of the plurality of memory cells is self-aligned, wherein the step of defining the plurality of magnetic memory cells further includes
    defining a portion of the plurality of memory cells;
    depositing an additional spacer layer, a first portion of the additional spacer layer residing on the portion of the plurality of memory cells;
    removing a second portion of the additional spacer layer distinct from the first portion and adjacent to the portion of the plurality of memory cells; and
    defining a remaining portion of the plurality of memory cells.

2. The method of claim 1 wherein the plurality of memory cells reside on a substrate, wherein a first data storage layer of the plurality of data storage layers is smaller than a second data storage layer of the plurality of data storage layers, the second data storage layer being between the first data storage layer and the substrate.

3. The method of claim 2 wherein the step of defining the plurality of memory cells further includes removing a portion of the plurality of layers such that the first data storage layer is at least ten percent smaller than the second data storage layer.

4. The method of claim 3 wherein the first data storage layer has a first footprint, the second data storage layer has a second footprint, and the step of defining the plurality of memory cells further includes removing the portion of the plurality of layers such that the first footprint is at least thirty percent smaller than the second footprint.

5. The method of claim 3 wherein the step of defining the plurality of memory cells further includes removing the portion of the plurality of layers such that the first data storage layer is not more than thirty percent smaller than the second data storage layer.

6. The method of claim 3 wherein the step of defining the plurality of memory cells further includes removing the portion of the plurality of layers such that the first data storage layer is at least thirty percent and not more than fifty percent smaller than the second data storage layer.

7. The method of claim 2 wherein the step of defining the plurality of memory cells further includes removing a portion of the plurality of layers such that the first data storage layer has a first aspect ratio and the second data storage layer has a second aspect ratio substantially equal to the first aspect ratio.

8. The method of claim 1 wherein the step of depositing the plurality of layers further includes depositing a plurality of magnetic junction layers for a plurality of magnetic junctions and depositing at least one spacer layer between adjacent magnetic junctions of the plurality of magnetic junctions, the at least one spacer layer corresponding to the desired distance, the plurality of magnetic junction layers including a pinned layer and a nonmagnetic spacer layer for each of the plurality of data storage layers, the data storage layer corresponding to a free layer.

9. The method of claim 1 wherein the step of depositing the plurality of layers further includes depositing a pinned layer for the plurality of data storage layers and depositing at least one nonmagnetic spacer layer between the plurality of data storage layers, the nonmagnetic spacer layer corresponding to the desired distance, the free layer corresponding to the data storage layer.

10. The method of claim 1 wherein the step of defining the plurality of magnetic memory cells further includes setting the junction angle to be at least sixty degrees and not more than ninety degrees.

11. The method of claim 1 wherein the step of defining the plurality of magnetic memory cells further includes setting the junction angle to be not more than eighty-five degrees.

12. The method of claim 1 wherein the at least one junction angle further includes a plurality of junction angles for each of the plurality of magnetic storage cells.

13. A magnetic memory comprising:
    a plurality of memory cells, each of the plurality of memory cells including at least one magnetic junction and at least one selection device corresponding to the at least one magnetic junction, each of the at least one magnetic junction including a pinned layer, a plurality of nonmagnetic spacer layers and a plurality of data storage layers interleaved with the plurality of nonmagnetic spacer layers, each of the plurality of data storage layers having a critical switching current for spin transfer switching and a desired junction angle, the plurality of nonmagnetic spacer layers corresponding to a plurality of desired spacings between the plurality of data storage layers, a first nonmagnetic spacer layer of the plurality of nonmagnetic spacer layers being between the plurality of data storage layers and the pinned layer, the critical switching current of each of the plurality of data storage layers depending upon the desired junction angle and the desired spacing, the critical switching current of each of the plurality of data storage layers changing monotonically from the critical switching current of an adjacent data storage layer of the plurality of data storage layers, the desired junction angle for each of the plurality of data storage layers being different from the desired junction angle of another of the plurality of data storage layers, the desired junction angle for each of the plurality of data storage layers being acute, the adjacent data storage layer being between the pinned layer and the one of the plurality of data storage layers, the plurality of data storage layers being self-aligned, each of the plurality of memory cells capable of storing a plurality of bits;

a plurality of bit lines coupled with the plurality of memory cells; and a plurality of word lines coupled with the plurality of memory cells.

* * * * *